(12) United States Patent
Wiser

(10) Patent No.: US 12,308,330 B2
(45) Date of Patent: May 20, 2025

(54) CHIP TO CHIP INTERCONNECT BEYOND SEALRING BOUNDARY

(71) Applicant: Ceremorphic, Inc., San Jose, CA (US)

(72) Inventor: Robert Wiser, Santa Cruz, CA (US)

(73) Assignee: Ceremorphic, Inc., San Jose, CA (US)

( * ) Notice: Subject to any disclaimer, the term of this patent is extended or adjusted under 35 U.S.C. 154(b) by 627 days.

(21) Appl. No.: 17/588,767

(22) Filed: Jan. 31, 2022

(65) Prior Publication Data

US 2022/0415827 A1    Dec. 29, 2022

Related U.S. Application Data

(60) Provisional application No. 63/215,455, filed on Jun. 26, 2021.

(51) Int. Cl.
  *H01L 23/58*   (2006.01)
  *H01L 23/538*  (2006.01)

(52) U.S. Cl.
  CPC ........ *H01L 23/585* (2013.01); *H01L 23/5383* (2013.01)

(58) Field of Classification Search
  CPC ................ H01L 23/585; H01L 23/5383
  See application file for complete search history.

(56) References Cited

U.S. PATENT DOCUMENTS

| | | |
|---|---|---|
| 9,496,231 B1 | 11/2016 | Tsai et al. |
| 9,627,332 B1 | 4/2017 | Liang et al. |
| 2008/0017965 A1* | 1/2008 | Nomura ............... H01L 23/585 |
| | | 257/E21.598 |
| 2010/0084751 A1 | 4/2010 | Frederick et al. |
| 2010/0123219 A1 | 5/2010 | Chen et al. |
| 2014/0327115 A1 | 11/2014 | Vu et al. |
| 2018/0122754 A1 | 5/2018 | Tatour et al. |
| 2019/0181170 A1* | 6/2019 | Oishi ............... H01L 27/14638 |

* cited by examiner

*Primary Examiner* — Peniel M Gumedzoe
(74) *Attorney, Agent, or Firm* — File-EE-Patents.com; Jay A. Chesavage

(57) ABSTRACT

A plurality of integrated circuits each have a central interconnect region which is enclosed by an inner sealring, optional intermediate sealrings, and an outer sealring. Each sealring has a sealring gap for passage of a signal trace which connects a central interconnect of a first integrated circuit to a central interconnect of a second integrated circuit. In first example of the invention, the signal trace remains on a single layer and routes through sealring layer gaps between the first and second IC. In a second example of the invention, vias are used in gaps between sealrings for the signal trace to change layers such that the sealring gaps are not on the same layer. In a third example of the invention, the vias of the second example are replaced by capacitors with plates in adjacent layers.

19 Claims, 6 Drawing Sheets

| 202 | Deposit Layer of Insulator (SiN) |
| 204 | Pattern Resist / Etch SiN to form Channels |
| 206 | Deposit Metal (Cu) |
| 208 | Strip Resist, also removing metal overlaid on the resist |

Deposit Insulator (SiN)

Pattern Resist

Etch Channel in SiN

Deposit Metal (Cu)

Remove resist & overlaying metal

Repeat steps 3A–3E

Sealring with Same-Layer signal trace

Sealring with Layer-changing signal trace

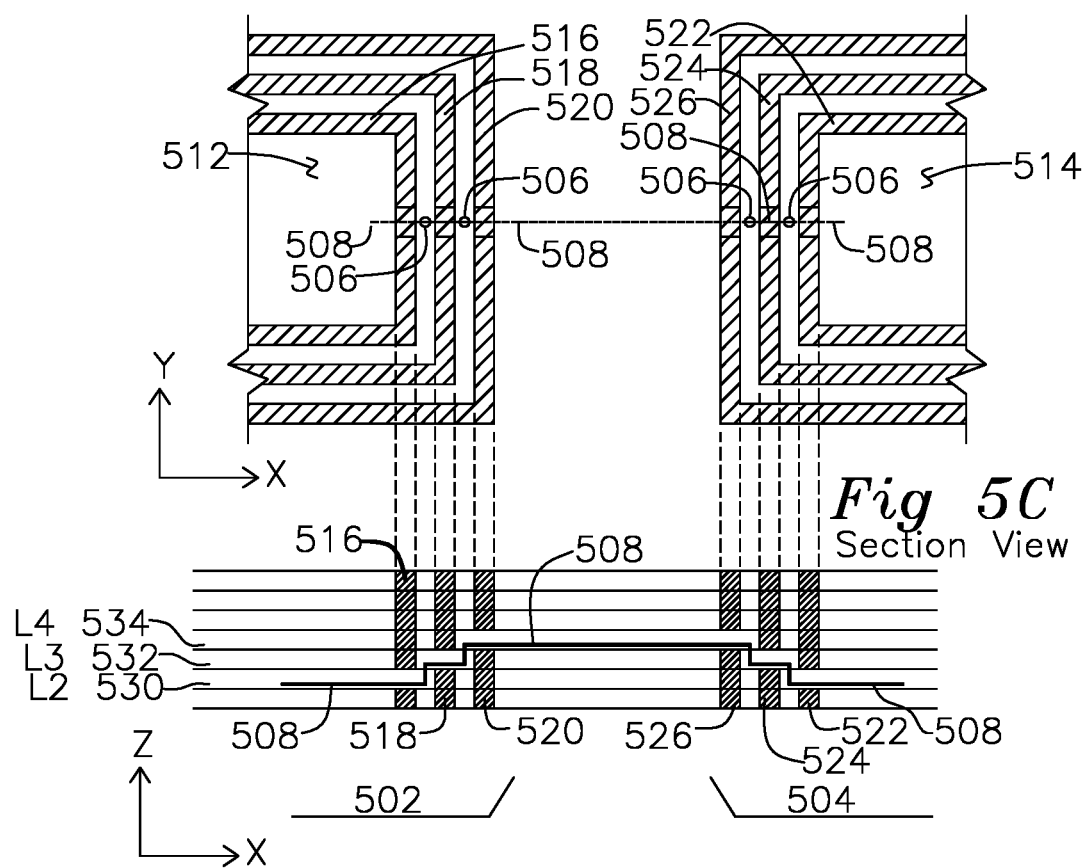

Figure 6A
Sealring with Capacitive Coupled Signal Trace
(Layer 3)
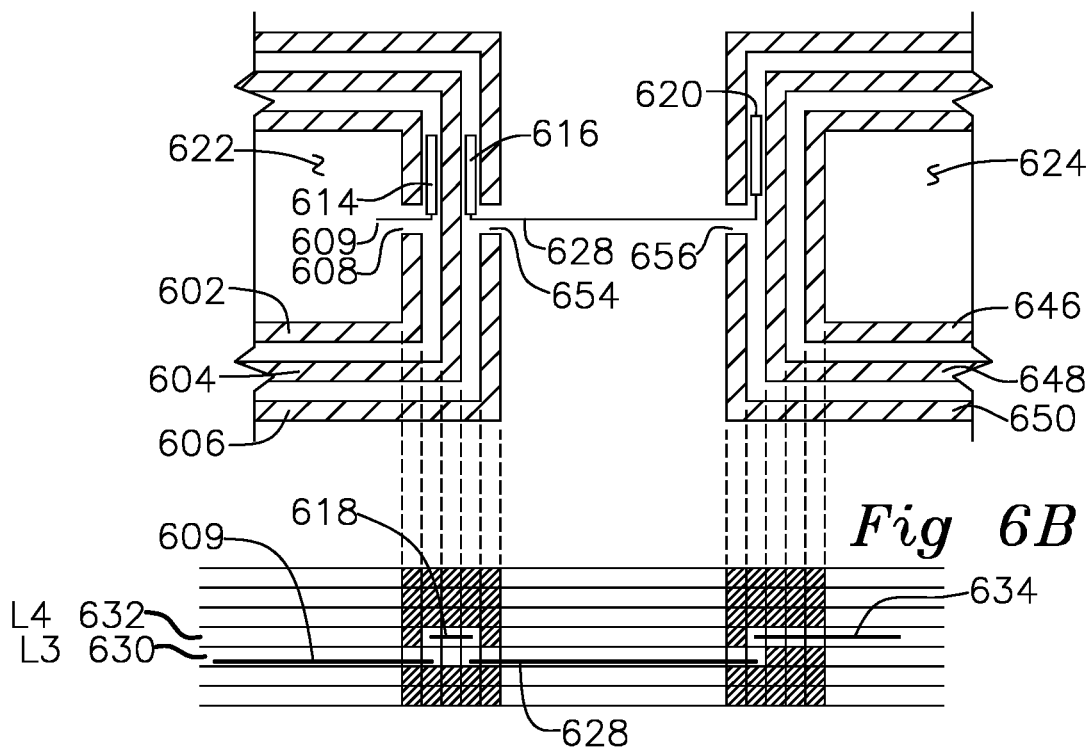
Fig 6B
Figure 6C
Sealring with Capacitive Coupled Signal Trace
(Layer 4)
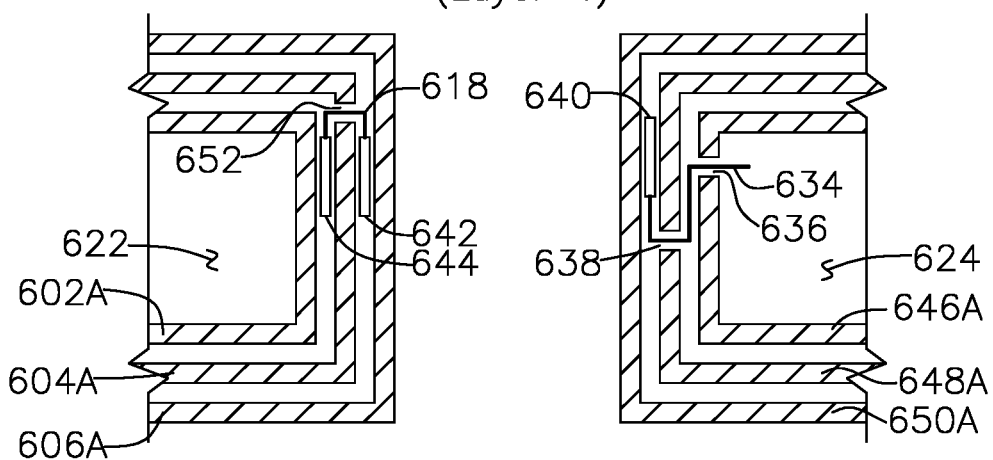

CHIP TO CHIP INTERCONNECT BEYOND SEALRING BOUNDARY

The present patent application claims priority to provisional patent application 63/215,455 filed Jun. 26, 2021.

FIELD OF THE INVENTION

The present invention relates to an apparatus and method for electrical interconnections. In particular, the invention relates to an apparatus and method for chip to chip communication on a single chip die.

BACKGROUND OF THE INVENTION

A typical integrated circuit (IC) comprises a wafer substrate such as a silicon wafer which contains a plurality of passive and active devices including transistors, resistors, and other elements fabricated on lower layers of the wafer and interconnected on upper layers of the wafer using alternating metal layers such as aluminum (Al) or Copper (Cu) and insulating layers such as silicon nitride (SiN) or silicon dioxide ($SiO_2$). The electrical interconnects include lands for electrical lead connections to a chip package such as balls on a flip chip or lands for wire bonding.

It is desired to provide a metallic sealring surrounding an IC fabricated on a substrate, the metallic sealring providing isolation of the IC from environmental contaminates while providing signal trace connectivity to other ICs on the same substrate.

OBJECTS OF THE INVENTION

A first object of the invention is a plurality of integrated circuits (ICs) on a substrate, each IC having device to device interconnections within each IC, the device interconnections formed on layers, the device interconnections surrounded by one or more sealrings formed by layers of conductors above other sealring layer conductors and in mutual electrical contact, at least one sealring layer having at least one sealring layer gap on at least one layer for penetration of a conductive signal trace, the sealring layer gap enclosing the conductive signal trace, the conductive signal trace leading to a sealring layer gap in a sealring of a different IC, thereby electrically connecting at least one IC to at least one other IC using the conductive signal trace while maintaining one or more respective sealrings surrounding each IC.

A second object of the invention is a plurality of integrated circuits (ICs) on a substrate, each IC having interconnections within each IC formed on metallization layers, the interconnections surrounded by stacked conductive sealring layers forming a continuous sealring which encloses each IC, the at least one sealring having at least one sealring gap on at least one sealring layer, the sealring gap providing the passage of a conductive signal trace which changes layers between sealring enclosed regions while maintaining either capacitive coupling or continuous signal trace connectivity, the changing of layers occurring one or more times between two sealring plurality of stacked layers of sealring conductors, the conductive signal trace passing through a gap in at least one sealring to electrically connect the signal trace to a different IC, thereby electrically connecting internal signals from at least one IC to at least one other IC.

A third object of the invention is a plurality of integrated circuits (ICs) on a substrate, each IC having interconnections within each IC, the interconnections surrounded by stacked sealring layers of a plurality of continuous conductor layers forming at least one sealring which encloses each IC, the at least one sealring layer of the sealring having at least one sealring layer gap, the sealring layer gap providing a passage for a conductive signal trace from a first interconnect layer of a first IC to a vertical capacitor formed by conductive plates separated by a dielectric layer, the signal trace coupled to a first conductive plate, the second conductive plate of the vertical capacitor coupled to a conductive signal trace and passing through a subsequent sealring gap in a sealring layer of the first IC to connect to a second IC after passing through a sealring gap in at least one sealring layer of the second IC, thereby interconnecting the first IC capacitively to the second IC.

SUMMARY OF THE INVENTION

A plurality of integrated circuits are formed on a substrate. Each integrated circuit comprises a plurality of active and passive devices such as transistors, resistors, and capacitors fabricated layer by layer on a series of device layers applied to a surface of a substrate. The transistors, resistors, capacitors, and other devices are interconnected with a plurality of subsequent interconnect layers, each interconnect layer comprising a metallization layer and an insulating layer with optional apertures for connection with the metallization layer of other interconnect layers. Each IC thereby comprises devices formed on lower layers and interconnects formed on subsequent layers, each interconnect layer having an insulating layer and a patterned metallization layer. The metallization layers include one or more layers of continuous conductors which surround the IC to form a sealring, the continuous conductors extending in a Z axis from a substrate surface to a top interconnect layer. The sealring structure forms a closed boundary which surrounds the IC, and isolates the IC transistors and other circuitry which are enclosed by the sealring from external environmental influences. One function of the sealring is to prevent the undesired intrusion of moisture, gasses, ions, or foreign gasses or liquids from getting past the sealring into the circuit devices, where they may cause long term degradation of the operation of the integrated circuit, such as by migration or corrosion of the metal layers or semiconductors enclosed by the sealring. In a typical IC, the sealring encloses the IC devices and interconnects, and the top surface of the IC is used to form leads for coupling electrical signals in and out of the IC, and the top surface is sealed with a similarly impervious passivation layer such as polyimide or other plastic, or silicon dioxide or silicon nitride or a mix of the two, with the electrical leads passing through apertures formed in the passivation layer to terminals used in the IC packaging and outside interconnects.

However, in certain applications, it is desired to fabricate and electrically connect ICs on a wafer and for electrical signal traces to couple from one IC to another IC on the same wafer. However, breaching the sealring may result in ingress of foreign materials to the integrated circuit. A motivation of the invention is to provide electrical signal trace connections from one IC to another IC on a wafer so that the IC to IC connections may be made without compromising the protection offered by the sealring.

In a first example of the invention, multiple sealring layers are provided which enclose a first IC in a series of annular rectangular or square rings with an annular gap between each sealring. An internal signal trace of the first IC passes through a sealring layer gap in an inner sealring of the first IC on a first layer, then the signal trace travels parallel to the inner sealring on the first layer of the first IC and changes direction to pass through a sealring layer gap in a second sealring which encloses the first sealring of the first IC, and continues to pass through a sealring layer gap in any optional subsequent sealring which encloses a previous sealring until the signal trace exits through a sealring layer gap in an outer sealring. The signal trace may travel beyond the outer sealring of the first IC to a second IC, which is similarly surrounded and enclosed by one or more annular sealrings formed by sealring layers with one or more respective sealring layer gaps on a layer. The associated sealring layer of the second IC similarly has a sealring layer gap on a particular interconnection layer to allow the passage of the signal trace through the sealring, which may subsequently turn parallel to a sealring of the second IC, thereafter passing through a sealring layer gap in an inner sealring layer on the same layer of the previous sealring layer gap, and continue until it reaches central interconnects of the second IC, thereby forming an electrical connection from the first IC to the second IC which passes through one or more sealring layer gaps of the first IC and second IC while maintaining a hermetic seal for each IC and preserving the function of the sealring.

In a second example of the invention similar to the first example, the coupling of the signal trace from one IC interconnect region and out of a sealring boundary is done using capacitive coupling, where a signal trace travels from an interconnect signal of the IC from within the first sealring layer through a sealring layer gap in the first sealring, and terminates in a conductive plate of a capacitor formed on a region between an inner sealring and an outer sealring. A second conductive plate of the capacitor is formed on an adjacent metal layer and separated from the first plate by an insulating (dielectric) layer, and a signal trace from the second plate of the capacitor on a different layer from the first plate passes through a sealring layer gap in a sealring layer which surrounds the inner sealring, and passes through a sealring layer gap in an outer sealring to a second integrated circuit, where it may similarly pass through a sealring layer gap in the outer sealring of the second IC. Each of the sealring layers of each IC forms a continuous metallized structure other than where sealring layer gaps are formed on respective layers. After the signal trace passes through the sealring gap in the outer sealring of the second IC, the signal trace may be coupled to a first plate of a second capacitor similarly having a second plate on an adjacent metal layer of the second IC which is separated by a dielectric insulating layer, the second capacitor located inside the outer sealring of the second IC, and the second capacitor similarly having a second plate which capacitively couples a signal carried by the signal trace conductor to other similarly formed capacitors between sealrings, or on conductors passing through sealring gaps on sealring layers until the signal trace reaches interconnects of the second IC.

In a third example of the invention, the IC is similarly surrounded by two or more annular sealrings, and a signal trace from an IC interconnect passes through a sealring layer gap in an inner sealring layer, thereafter passes through a via (a metallized aperture in an insulating layer separating two adjacent metallized layers) to a different conductive layer, the conductive signal trace thereafter passing through a sealring layer gap in a subsequent outer sealring layer, optionally through one or more additional vias to a different conductive signal trace layer and through a sealring gap in a subsequent outer sealring layer and passing to a second IC, where it may similarly pass through a sealring layer gap in an outer sealring layer and thereafter change layers before passing through a sealring layer gap in a subsequent inner sealring layer and reaching interconnects of the second IC inside the inner sealring.

In each example of the invention, the signal trace is connected to a desired interconnect layer signal or device of the IC, and one or more sealrings surrounds the devices of the IC, and only the particular layer which has a signal trace passing through the sealring has a sealring gap to accommodate the signal trace, and intervening insulating layers are only present the region above and below the sealring layer gap, whereas the rest of the sealring layer and layers above and below are metallized. Each conductive signal trace passing through a sealring gap may thereafter travel on the same layer to a sealring gap in a different sealring on the same layer of the first example, or it may be capacitively coupled to a different layer and pass through a sealring gap in a sealring on a different sealring layer, or it may be electrically connected by a metallized via in a region between sealrings which changes the signal to a different layer before passing through a sealring layer gap in a subsequent outer sealring layer.

In this manner, the protective barrier of the sealring is preserved, while providing electrical interconnections from chip to chip on a die.

BRIEF DESCRIPTION OF THE DRAWINGS

FIG. 5B is a projection plan view of FIG. 5A.

FIG. 5C is a section view of FIG. 5B similar to FIG. 5A magnified in Z axis for clarity.

FIG. 6A shows a plan view of layer 3 capacitive coupled signal traces between two ICs according to a second example of the invention, with the signal trace and sealring gaps on different layers.

FIG. 6B is a section view of FIG. 6A.

FIG. 6C shows a plan view of a layer 4 signal trace between two ICs corresponding to the layer 3 view of FIG. 6A.

DETAILED DESCRIPTION OF THE INVENTION

In the present application, the same reference number in different views identifies the same structures.

Figure 1A:
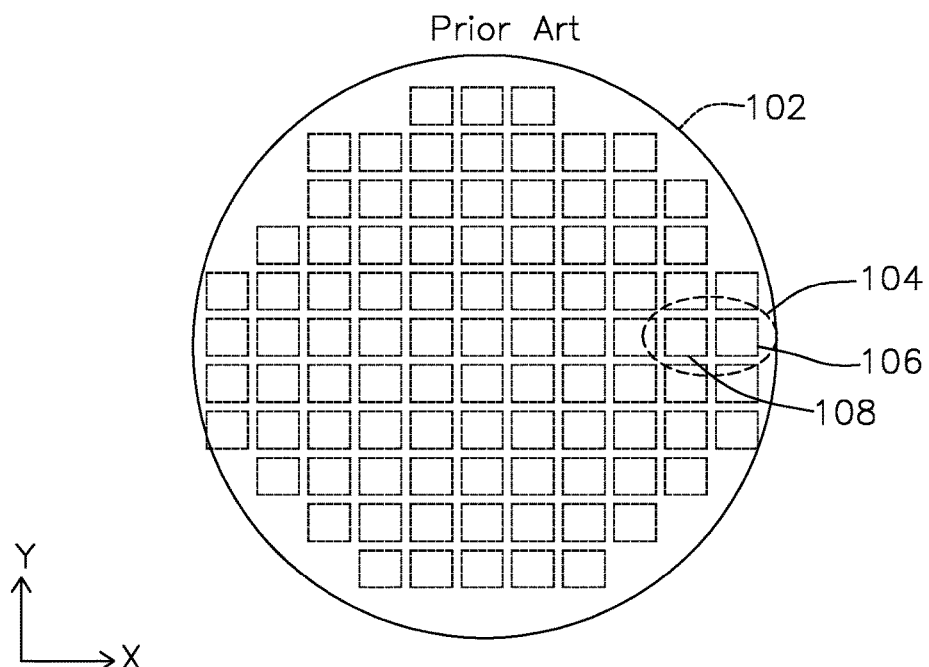
FIG. 1A is a plan view of a prior art silicon wafer with individual ICs.

FIG. 1A shows a prior art wafer 102, which has integrated circuits 106 and 108 next to each other in region 106.

Figure 1B:
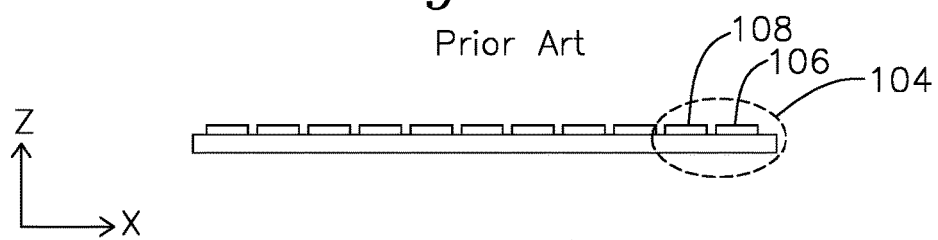
FIG. 1B is a cross section view of FIG. 1A identifying two particular ICs.

FIG. 1B shows the prior art wafer 102 in a section view, which has integrated circuits 106 and 108 next to each other in region 106. The Z axis dimension is greatly exaggerated to show the extent of each individual integrated circuit represented by dashed lines in FIG. 1A.

Figure 1C:
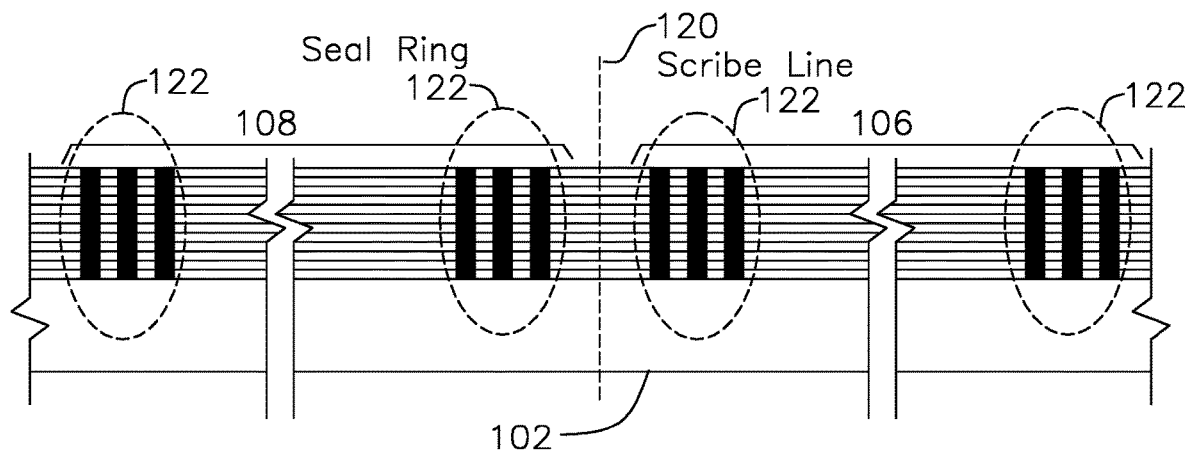
FIG. 1C shows a magnified view of sealrings of the present invention applied to the structure of prior art FIG. 1B for an extent of ICs, the ICs separable by a scribe line.
Figure 1D:
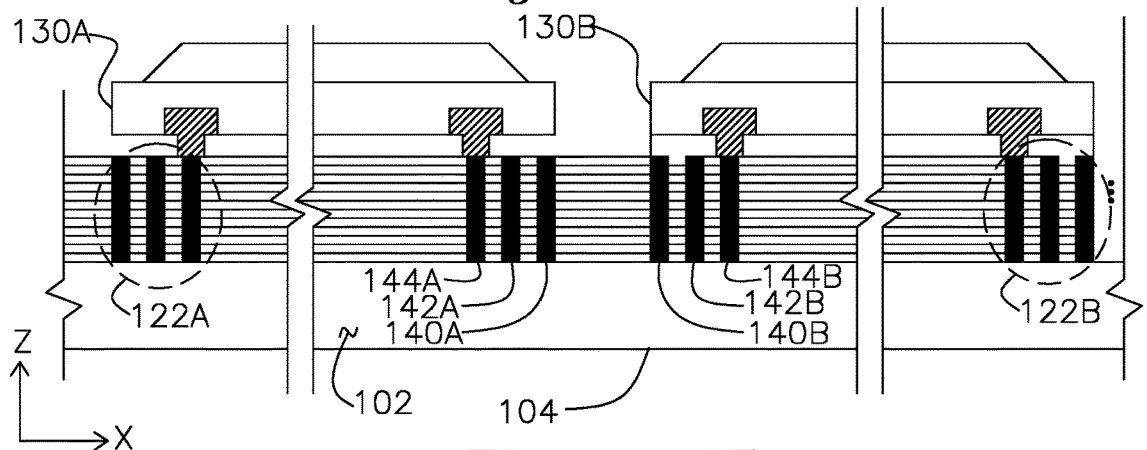
FIG. 1D shows an IC packaging step of FIG. 1C.
Figure 1E:
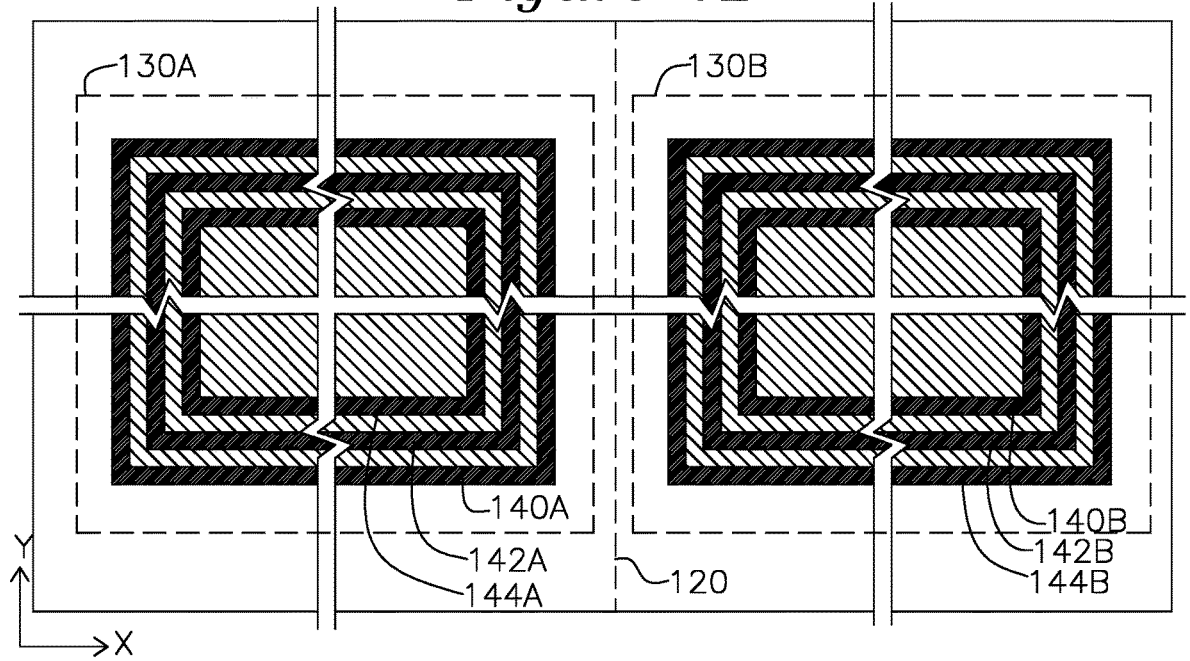
FIG. 1E shows a wafer slicing step before FIG. 1D or after FIG. 1C.
Figure 1F:
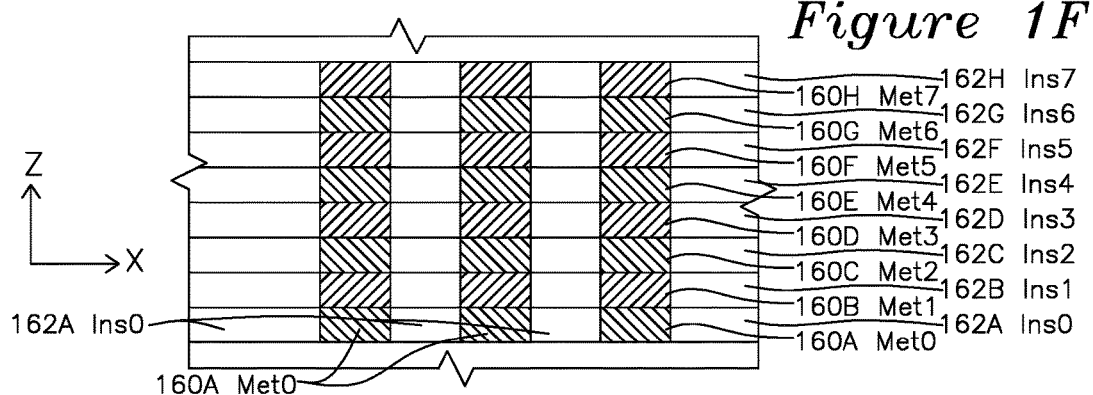
FIG. 1F shows a section view of metallized and insulating layers of an integrated circuit forming a sealring.

FIG. 1C shows a magnified cross section view of the invention, adding sealrings 122 of the present invention to prior art FIG. 1B with respect to IC 106 and 108 of the prior art. The sealrings 122 of the present invention are continuous in the Z axis at the boundaries of each IC 106 and 108. A scribe line 120 is shown, such that after fabrication, the chips are typically diced by scribing or laser cutting a fracture line in the X and Y axis between the individual ICs, and then cleaving the die 102 until the individual ICs such as 106 and 108 are released in individual form from the wafer 102. The sealrings 122 of each IC are continuous metallization in the Z axis and surround each IC to prevent the ingress of undesired vapors or liquids for the life of the IC, and the top layer may be metallized and coated with an epoxy or polyimide in a manner which allows all of the lead connections to be taken from the top of the chip (not shown). FIG. 1D shows packaging 130A and 130B with respect to sealrings 122 and substrate 102, and FIG. 1E shows a plan projection view of substrate 102 with packages 130A, 130B, and inner sealring 144A and 144B, middle sealring 142A and 142B, and outer sealring 140A and 140B. FIG. 1E shows a section view of metallized layer structures 160A, 160B, . . . , to 160H and insulating layers 162A, 162B, . . . , 162H which may be fabricated and incorporated into prior art chips such as 106 and 108 to form example sealrings 144A, 142A, 140A or 144B, 142B, 140B of FIG. 1E.

Figure 2:
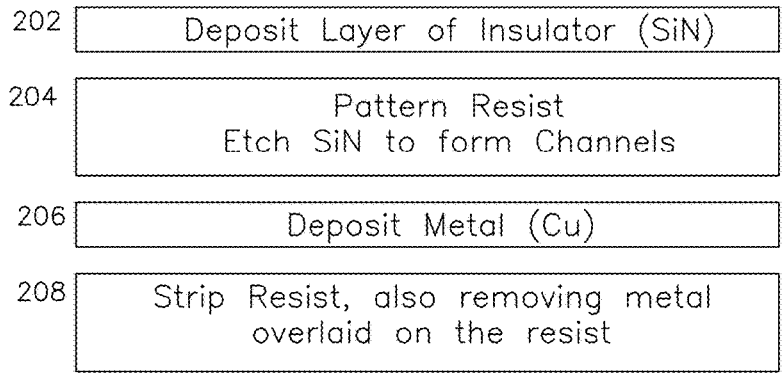
FIG. 2 is a process flow for forming multiple layers of interconnect layers, each interconnect layer having a patterned insulator overlaid with a patterned conductor.
Figure 3A:
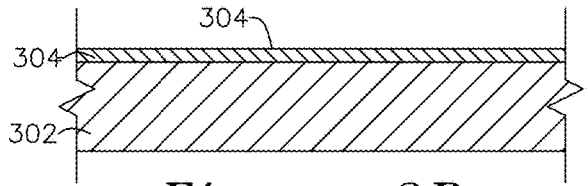
FIGS. 3A through 3E show section views following a sequence of process steps for forming a sealring layer.
Figure 3B:
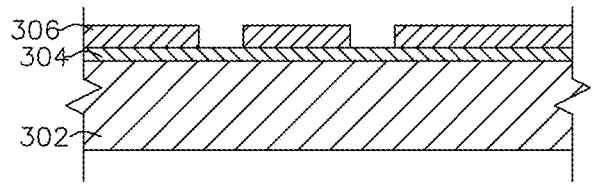
Figure 3C:
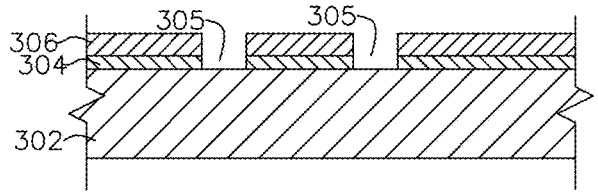
Figure 3D:
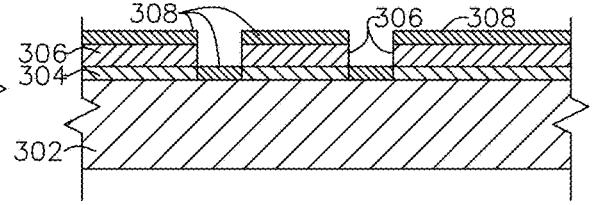
Figure 3E:
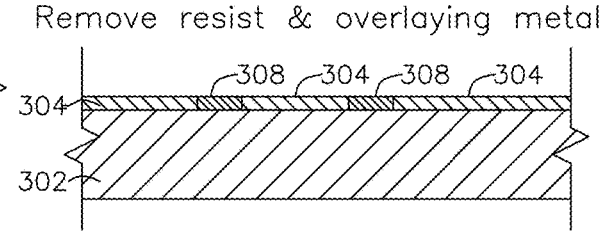
Figure 3F:
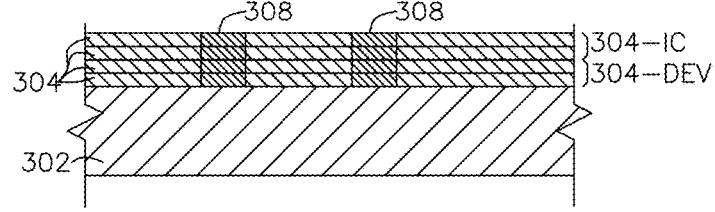
FIG. 3F shows a section view of a sealring after performing the process steps 3A-3E four times.

FIG. 2 and corresponding FIGS. 3A to 3E show a process for forming a sealring 308-1 of FIG. 3F, which comprises a plurality of interconnect layers and etched insulating dielectric layers formed concurrently with interconnect layers inside the boundary of the sealring and which interconnects the devices (transistors, resistors, etc) fabricated on lower layers of the IC.

As a matter of convention which follows the fabrication of structures of the present invention, fabrication begins on a substrate layer such as 302 of FIG. 3. Accordingly, a structure that is "above" a referenced layer is deposited on top of the referenced layer, and a structure that is "below" a referenced layer was previously deposited on the substrate side of the referenced layer.

In the present specification, sealrings are described as annular rings, which is understood to be any plurality of shapes or patterns surrounding other shapes or patterns and which provide at least one region between adjacent sealrings for a signal trace to traverse from one sealring gap to another sealing gap, either on a same sealring gap layer or a different sealring gap layer. The number of sealrings to practice the invention may be 1 or 2 or more.

Each interconnect layer comprises an optionally patterned insulator layer (such as 162A, 162B, . . . , 162H) overlaid with an optionally patterned metal layer (such as 160A, 160B, . . . 160H), and either the insulator layer or metal layer may be patterned, as required for each particular IC. The deposition order of insulator and conductor may be reversed in other examples of the invention, the present order is shown only for clarity in understanding the invention. FIG. 2 shows the first step 202 of deposition of an unpatterned insulating layer such as $Si_3N_4$ or $SiO_2$, shown in FIG. 3A as insulator 304 over substrate 302. In step 204, a patterned resist is applied, shown as 306 of FIG. 3B, followed by a plasma or chemical etch which forms channels 305 in the insulator 304 shown in FIG. 3C. Metal deposition is performed in step 206, such as with Cu or Al, shown as metal deposition layer 308 of FIG. 3D. The resist 306 and overlaid metal 308 is removed with the underlying resist 306 in step 208, resulting in the co-planar insulation 304 and conductive metal 308. To form a sealring, the metal layers 308 are stacked on top of each other by performing steps 202 to 208 multiple times, shown as four iterations to generate the sealring 308-1 of FIG. 3F. For fabrication of a patterned or unpatterned metal layer over the insulation layer, the metal deposition is done directly over the insulation layer with or without a pattern mask such as photoresist. Substrate 302 has a plurality of device layers 304-DEV above the substrate 302, and a plurality of interconnect layers 304-IC above the device layers 304-DEV, as shown in FIG. 3F.

Figure 4:
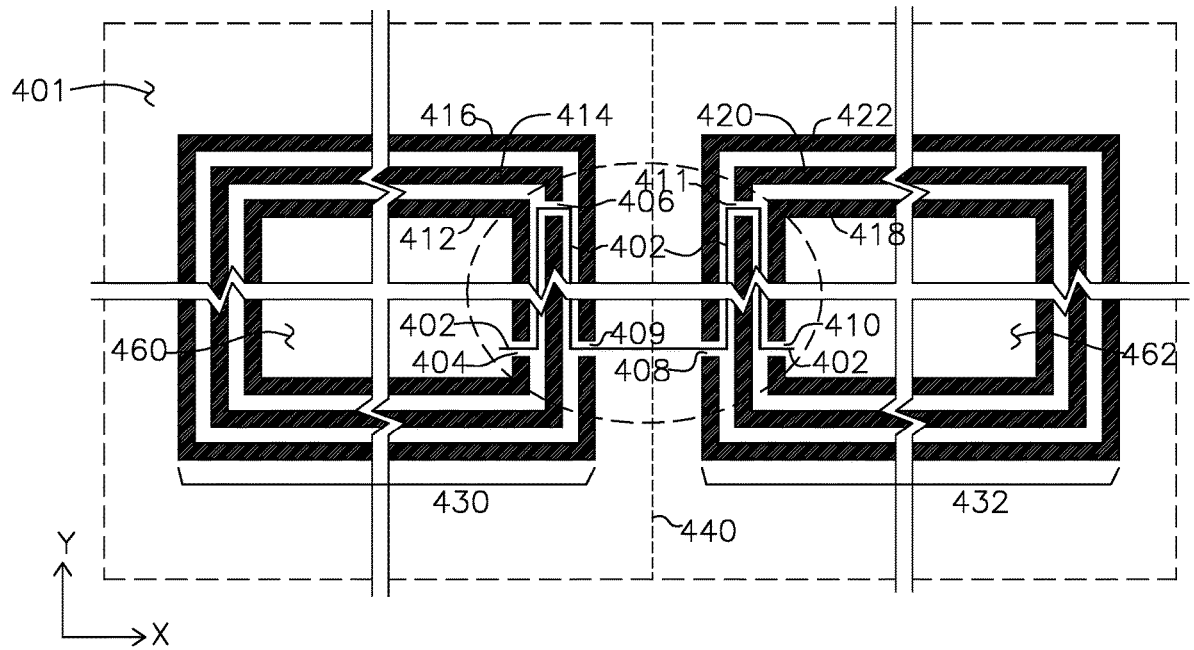
FIG. 4 shows a single layer plan view of two ICs with sealrings and connected with signal traces on a same layer and with offset sealring gaps.

FIG. 4 shows a first example of the invention, where a conductive signal trace from a central device interconnect region 460 of a first IC 430 (such as an input/output or I/O connection to the IC) is routed from a device or interconnect of the interconnect region through sealring gaps in the first IC 430 and across the substrate to a central device interconnect region 462 of second IC 430. First IC 430 has a plurality of sealrings including at least an inner sealring 412, an outer sealring 416, and one or more intermediate sealrings 414. Each sealring comprises the vertical stack of metal deposition 308-1 of FIG. 3F, but where a sealring layer on the conductive signal trace layer has a sealring gap layer for the passage of the conductive signal trace 402, which may route parallel to the sealring to a subsequent outer sealring layer gap until the conductive signal trace traverses all of the sealrings 412, 414, and 416 to beyond the extent of the outer sealring 416. In the first single-layer IC 430 to IC 432 sealring and signal trace example of FIG. 4, each sealring layer above and below FIG. 4 is continuous, and first IC 430 has a sealring layer (shown in the plan view of FIG. 4) with sealring layer gap 404, sealring layer gap 406, and sealring layer gap 409 in sealrings 412, 414, and 416, respectively. The second IC 432 has annular sealrings 418, 420, and 422 of second IC 432, and each sealring layer has associated sealring layer gaps 410, 411, and 408 respectively for passage of conductive signal trace 402. In this example, the sealring layer gaps of each subsequent sealring layer are offset to prevent (or greatly increase the path length for) ingress of moisture or vapors, and the conductive signal trace 402 is routed from interconnect area 460 of first IC 430 to interconnect area 462 of second IC 432 while maintaining the sealring functionality of the prior art. For applications where inter-chip connectivity of signal trace 402 is not required, the chip may be diced along dicing line 440, as before, and the chips packaged individually with the chip I/O connections terminated in a chip package of the prior art. In applications where multi-chip communications are required, multiple IC to IC connections such as mesh connections between ICs may be performed in this manner, with signal traces exiting each of the four sides of the rectangular IC to surrounding ICs. The present example shows a single conductive signal trace 409 from first IC 430 to second IC 432 for illustrative purposes in understanding the first example of the invention, where the connection is on a single metallization layer, and the metallization layers above and below the sealring layer shown in FIG. 4 have a continuous sealring without a sealring gap. The sealring layer gap and region above and below the sealring layer gap includes an insulating layer which is present only above and below the sealring gap itself and provides insulation of the conductive signal trace 409 from the conductive sealring of the adjacent layers.

Figure 5A:
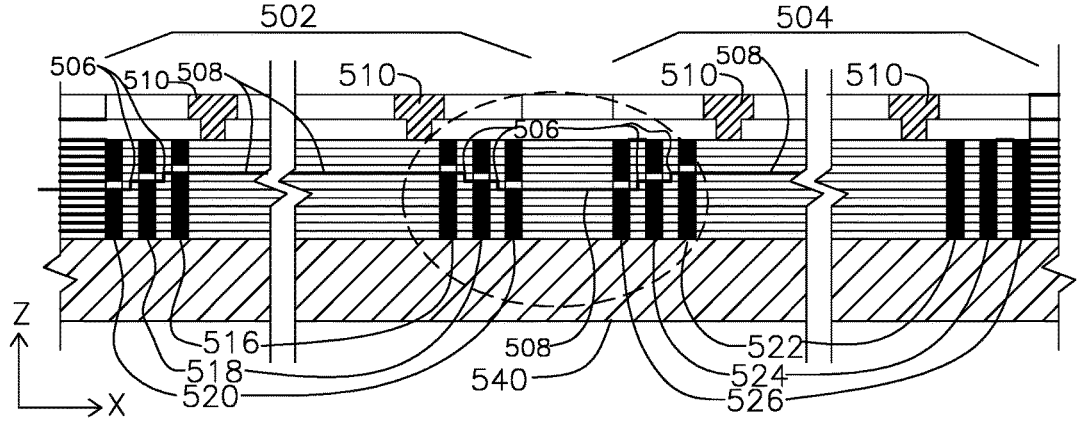
FIG. 5A shows a cross section of a signal trace connecting two ICs according to an example of the invention, with the signal trace and sealring gaps on different layers.

FIGS. 5A, 5B, and 5C show a second example of the invention, where the conductive signal trace changes from one layer to another, and multiple layers are used. FIG. 5A is a cross section view of the sealring layers, FIG. 5B is a projected plan view through multiple sealring layers, and FIG. 5C is a section view of FIG. 5B. In the section view of FIG. 5C, a signal trace 508 routes from a first IC 502 interconnect region 512 to a second IC 504 interconnect region 514 where signal trace 508 switches from layer 2 (L2) 530 to layer 3 (L3) 532 between sealrings 516 and 518, and then to layer 4 (L4) 534 between sealrings 518 and 520 using vias 506 (metallized apertures in an insulating layer) connecting adjacent layers in a region between inner to outer sealrings 516, 518, 520, respectively and as shown in FIG. 5C when leaving interconnect region 512. When conductive signal trace 508 traverses to the second IC 504 interconnect region 514, it passes through sealring layer gaps in sealrings 526, 524, and 522 and the conductive signal trace changing layers using vias 506 as it traverses to second IC 504 interconnect region 514. FIG. 5A shows an overall section view of the layers, and magnified FIG. 5C shows selected layers 530, 532, and 534 in greater detail. The Z axis extent has been exaggerated to show the separation of the signal trace from the layer for clarity, although has been shown in FIGS. 2 and 3 to 3F that each signal trace layer comprises a patterned insulator layer 304 and patterned conductive layer 308. Layer to layer via connections 506 for signal traces on different layers may be formed by patterning the conductive layer and insulating layer to provide such connection including leaving insulation above and below conductive signal trace 508 in the region of the sealring gap as the conductive signal trace 508 passes through each sealring layer gap to prevent electrical connection to the sealring itself, as is well known in the art of integrated circuit fabrication. FIG. 5B shows a projection view through the layers of the IC, where all of the sealrings are shown in cross-hatch, and where the sealring gap locations are clearly indicated in cross section FIG. 5C, although it is understood that the gaps need not be in the same cross section, and may be offset from each other in the Y direction, for example. It is believed that in certain circumstances, the use of metallized vias 506 for the signal trace 508 to change layers and placing the sealring gaps in different layers provides improved resistance to intrusion of vapors or liquids than may be provided over the single layer scheme of FIG. 4.

FIGS. 6A, 6B, and 6C show a third example of the invention using capacitive coupling of the signal trace in place of the direct electrically coupling of vias 506 of FIGS. 5A, 5B, and 5C for layer to layer connection using displacement currents across adjacent plates formed by conductive signal traces separated by a dielectric insulator, which may provide greater inter-layer isolation by eliminating the need for via 506 of FIG. 5 and associated aperture penetration through an insulating layer. First IC interlayer connectivity region 622 is surrounded by an inner sealring 602, one or more intermediate sealrings 604, and an outer sealring 606, and second IC interlayer connectivity region 624 similarly has an inner sealring 646 surrounding the connectivity region 624, one or more intermediate sealrings 648, and outer sealring 650. FIG. 6A shows structures of layer 3 and FIG. 6C shows structures of layer 4, with FIG. 6B showing a cross section projection view with the respective structures and layers shown. An example signal trace 609 leaves layer 3 630 of the connectivity region 622 and passes through a sealring 602 layer gap 608, after which the signal trace 609 terminates into a first capacitor plate 614 which is fabricated from a conductor also on layer 3 630. Lower capacitor plate 614 is separated by a dielectric layer to corresponding upper capacitor plate 644 formed from a conductor on adjacent layer, such as layer 4 shown in FIGS. 6B and 6C. Upper capacitor plate 644 is coupled via signal trace 618 on layer 4 and passes through a sealring gap 652 of layer 4 sealring 604A (connected to sealring 604) and terminates into upper capacitor plate 642 on layer 4. Layer 4 upper capacitor plate 642 is coupled through the dielectric insulating layer to layer 3 lower capacitor plate 616, which is coupled to signal trace 628 which passes through outer sealring layer 606 gap 654 and enters second IC outer sealring 650 gap 656 to layer 3 lower capacitor plate 620. Lower capacitor plate 620 of layer 3 is capacitively coupled to corresponding capacitor upper plate 640 of layer 4 shown in FIG. 6C for receiving displacement currents, which are coupled to signal trace 634 passing through intermediate sealring 648A gap 638 and inner sealring 646A gap 636 to second IC interconnection region 624. Although the examples show two capacitor couplings leaving region 622 and one capacitor coupling for reaching region 624, this is for example purposes only. It will be clear to one skilled in the art that coupling signals through capacitors requires certain DC restoration operations, or encoding methods such as the use of self-clocking such as non-return-to-zero (NRZ) data encoding, in one example of the invention using capacitive coupling of FIGS. 6A to 6C.

The IC to IC signal trace and sealring configurations and methods shown in FIGS. 4, 5A-5C, and 6A to 6C are shown individually for clarity of the invention, but may be mixed and matched without limitation and are only provided to give specific examples of the invention, which scope is only limited by the claims.

Integrated circuit dimensions on the nanoscale are commonly used for the structures of the invention. For example, the signal trace line widths may be on the order of 100 nm to 10 um, the capacitor width may be on the order of 1 um to 100 um, the capacitor length may be on the order of 10 um. The thickness of an insulating layer may be on the order of 100 nm, and the thickness of a conductive layer may be on the order of 100 nm. Sealrings may be on the order of 1 u in width, and the number of sealrings may be in the range from 1 to 10. Insulating layer materials may be any of the well-known semiconductor fabrication materials, including silicon dioxide $SiO_2$, or silicon nitrides such as $Si_3N_4$ or SiN, Conductor layer materials may be any of the metals copper (Cu), Aluminum (Al), Gold (Au), Nickel (Ni), or Tungsten (W).

A dimension which is "on the order of" a nominal value is understood to be in the range 0.1 the nominal value to 10 the nominal value, and where a range of "on the order of X to Y" is understood to include the range from 0.1X to 10Y without limitation, and alternatively the range 0.1X to 10X as well as 0.1Y to 10Y. A dimension which is "approximately" a nominal value is understood to be in the range of the nominal value+/−50% of the nominal value.

The present examples are provided for illustrative purposes only, and are not intended to limit the invention to only the embodiments shown.

I claim:

1. A signal connection apparatus from a first integrated circuit (IC) to a second IC, each IC comprising a central device interconnect region formed by a plurality of layers comprising patterned metal layers, insulating layers positioned adjacent to each patterned metal layer, and electronic circuit layers comprising passive and active devices interconnected within the central device interconnect region, the central device interconnect region surrounded by at least one inner sealring comprising patterned metal layers adjacent to metal deposited in voids of insulating layers adjacent to the patterned metal layers, thereby creating stacked metal sealring layers surrounding and enclosing the central device interconnect region, at least one patterned metal layer of the inner sealring including a sealring layer gap for the passage of one or more conductors; the signal connection apparatus comprising:

the first IC having an inner sealring layer gap on an inner sealring layer and an outer sealring layer gap on an outer sealring of a IC sealring layer, the outer sealring layer gap on a same patterned metal layer but offset in position from the inner sealring layer gap;

the second IC having an inner sealring layer gap on the second IC inner sealring layer and an outer sealring layer gap on an outer sealring of a second IC sealring layer but offset in position from the second IC inner sealring layer gap;

at least one conductive signal trace of a patterned metal layer of the first IC central device interconnect region connected through the first IC inner sealring layer gap and through the first IC outer sealring layer gap and through the second IC outer sealring layer gap and through the second IC inner sealring gap to the central device interconnect region of the second IC.

2. The signal connection apparatus of claim 1 wherein each sealring layer gap comprises an insulating layer and a patterned metal layer in an extent of a sealring layer gap.

3. The signal connection apparatus of claim 2 wherein each layer of a sealring not having a sealring layer gap is electrically connected to other layers of a sealring.

4. The signal connection apparatus of claim 2 wherein the insulating layer comprises at least one of: silicon nitride (SiN or $Si_3N_4$) and silicon dioxide $SiO_2$.

5. The signal connection apparatus of claim 2 wherein the patterned metal layers comprise at least one of: aluminum (Al), Copper (Cu), Gold (Au), Nickel (Ni), and Tungsten (W).

6. The signal connection apparatus of claim 1 wherein the inner sealring is a plurality of sealrings.

7. The signal connection apparatus of claim 1 wherein a number of sealring gaps is at least one and a number of sealrings is at least two.

8. A plurality of sealrings formed on a plurality of sealring layers, each sealring enclosing an integrated circuit except in a gap area of a respective sealring on a particular sealring layer, the respective sealring gap area providing at least one signal trace passing through the sealring gap area and beyond an extent of the respective sealring, each respective sealring comprising:

the plurality of sealring layers corresponding to a number of process patterned metal layers and patterned insulating layers of the integrated circuit;

the patterned insulating layers having voids deposited with metal and in contact with an adjacent patterned metal layers;

each sealring layer thereby comprising a metal deposition layer in contact with patterned metal deposition formed into an adjacent metal deposition layer;

the gap area comprising at least one sealring layer having a sealring layer gap on a patterned metal layer corresponding to a patterned metal layer of the at least one signal trace, the at least one signal trace passing through the sealing gap area;

the sealring gap area including a corresponding insulating layer above and below the signal trace;

and where a gap area of a respective sealring is offset in a same layer or in a different layer from a gap area of a different sealring.

9. The sealring of claim 8 wherein the plurality of sealrings is configured as a plurality of annular sealrings.

10. The sealring of claim 9 further comprising:
the signal trace changes layers in a region between adjacent sealrings.

11. The sealring of claim 10 further comprising:
the signal trace changes layers through an electrically continuous metallized via aperture.

12. The sealring of claim 10 further comprising:
the signal trace changes layers through a capacitive coupling formed by conductive plates separated by an insulating layer.

13. The sealring of claim 10 wherein at least one sealring layer gap is offset from a sealring layer gap of an adjacent sealring.

14. The sealring of claim 8 wherein the patterned metal layer forming the sealring comprises at least one of: copper (Cu), Aluminum (Al), Gold (Au), Nickel (Ni), or Tungsten (W).

15. The sealring of claim 8 wherein the patterned insulating layer comprises at least one of: silicon nitride such as SiN or $Si_3N_4$, and silicon dioxide $SiO_2$.

16. An apparatus comprising:
a first integrated circuit (IC) and a second IC, each IC comprising, in sequence: a substrate, device layers for forming active and passive devices of the IC, and interconnect layers providing electrical connectivity for the active and passive devices of the IC, at least one interconnect layer comprising an insulator and patterned conductors;

each IC having one or more sealrings, each sealring comprising successive layers of metallization on the substrate and having a same number of device layers and interconnect layers as a respective integrated circuit;

at least one signal trace connecting interconnect layers of the first IC and the second IC, the at least one signal trace passing through a sealring layer gap in each respective sealring of the first IC and the second IC;

where the signal trace passes through a first sealring layer gap of the first IC and also a second sealring layer gap of the first IC, and where the first sealring layer gap and the second sealring layer gap are on the same layer and offset from each other, or the first sealring layer gap and second sealring gap are on different layers.

17. The apparatus of claim 16 wherein at least one of the sealring or the patterned conductors comprises: copper (Cu), Aluminum (Al), Gold (Au), Nickel (Ni), and Tungsten (W).

18. The apparatus of claim 17 wherein the insulator comprises at least one of: silicon dioxide $SiO_2$, or a silicon nitride such as $Si_3N_4$ or SiN.

19. The apparatus of claim 16 wherein the signal trace is a patterned conductor on a layer having an insulating layer above and an insulating layer below the signal trace in a region of the sealring layer gap.

* * * * *